(12) United States Patent
Endo et al.

(10) Patent No.: US 9,379,477 B2
(45) Date of Patent: Jun. 28, 2016

(54) SEAL HAVING A PACKING PORTION EXTENDING FROM A FLAT PORTION WITH A STEP

(71) Applicant: DAI-ICHI SEIKO CO., LTD., Kyoto (JP)

(72) Inventors: Takayoshi Endo, Shizuoka (JP); Shogo Jinnouchi, Fukuoka (JP); Hisashi Hamachi, Fukuoka (JP)

(73) Assignee: DAI-ICHI SEIKO CO., LTD. (JP)

( * ) Notice: Subject to any disclaimer, the term of this patent is extended or adjusted under 35 U.S.C. 154(b) by 0 days.

(21) Appl. No.: 14/558,294

(22) Filed: Dec. 2, 2014

(65) Prior Publication Data
US 2015/0180159 A1 Jun. 25, 2015

(30) Foreign Application Priority Data

Dec. 20, 2013 (JP) .................................. 2013-264075
Dec. 20, 2013 (JP) .................................. 2013-264180
Jan. 14, 2014 (JP) .................................. 2014-004432

(51) Int. Cl.
*H01R 13/40* (2006.01)
*H01R 13/516* (2006.01)
*H01R 12/50* (2011.01)
*H01R 13/60* (2006.01)
(Continued)

(52) U.S. Cl.
CPC .......... *H01R 13/516* (2013.01); *H01R 13/5202* (2013.01); *H01R 13/60* (2013.01); *H01R 23/7021* (2013.01); *H05K 5/0069* (2013.01); *Y10T 29/49826* (2015.01)

(58) Field of Classification Search
CPC . H01R 13/52; H01R 13/5202; H01R 13/5219
USPC .................................. 439/271–275, 587–588
See application file for complete search history.

(56) References Cited

U.S. PATENT DOCUMENTS 4,611,872 A * 9/1986 Ito ...................... H01R 13/5219
439/277
4,676,575 A * 6/1987 Denlinger ............ H01B 17/308
439/271

(Continued)

FOREIGN PATENT DOCUMENTS

JP 06045032 2/1994 ............. H01R 13/74
JP 3049174 6/1998 ............. H01R 13/74

(Continued)

OTHER PUBLICATIONS

Office Action issued in U.S. Appl. No. 14/558,258, dated Dec. 2, 2015 (18 pgs).

(Continued)

*Primary Examiner* — Chandrika Prasad
(74) *Attorney, Agent, or Firm* — Hayes Soloway P.C.

(57) ABSTRACT

A seal used for an electric connector having a part protruding outwardly through a first opening formed at a wall of a casing, the seal filling a space formed between an outer surface of the part and an inner surface of the first opening, includes a flat portion formed with a second opening having an inner edge entirely or partially identical in shape with an inner edge of the first opening, the flat portion lying on the wall such that the second opening overlaps the first opening, and a packing portion extending from the flat portion, and making close contact with both the outer surface of the part and the inner surface of the first opening.

9 Claims, 11 Drawing Sheets

(51) Int. Cl.
*H01R 13/52* (2006.01)
*H05K 5/00* (2006.01)

(56) References Cited

U.S. PATENT DOCUMENTS

| | | | | |
|---|---|---|---|---|
| 4,917,620 | A * | 4/1990 | Samejima | H01R 13/5219 439/271 |
| 5,173,061 | A | 12/1992 | Comerci et al. | 439/536 |
| 5,362,243 | A | 11/1994 | Huss | 361/749 |
| 5,389,005 | A * | 2/1995 | Kodama | H01R 13/5219 439/272 |
| 5,857,863 | A | 1/1999 | Onizuka | 439/248 |
| 6,547,576 | B2 | 4/2003 | Peng | 439/173 |
| 7,066,751 | B2 | 6/2006 | Chen | 439/247 |
| 7,530,818 | B1 | 5/2009 | Wang | 439/638 |
| 8,066,518 | B2 | 11/2011 | Homme et al. | 439/78 |
| 8,162,676 | B1 | 4/2012 | Hsieh et al. | 439/76.1 |
| 8,734,172 | B2 | 5/2014 | Takei | 439/248 |
| 8,734,174 | B2 * | 5/2014 | Nakamura | H01R 13/504 439/271 |
| 8,770,989 | B2 | 7/2014 | Ohhashi | 439/589 |
| 8,773,860 | B2 | 7/2014 | Wang | 361/725 |
| 8,942,001 | B2 | 1/2015 | Kawai | 174/50.5 |
| 8,992,249 | B2 | 3/2015 | Kobayashi | 439/362 |
| 2011/0111610 | A1 * | 5/2011 | Kim | H01R 13/6599 439/157 |
| 2011/0300731 | A1 * | 12/2011 | Nakamura | H01R 13/504 439/271 |
| 2012/0115356 | A1 | 5/2012 | Tashiro | 439/538 |
| 2015/0155651 | A1 | 6/2015 | Ejiri | H01R 13/5213 |
| 2015/0180159 | A1 | 6/2015 | Endo et al. | H01R 13/5202 |

FOREIGN PATENT DOCUMENTS

| | | | |
|---|---|---|---|
| JP | 2001345153 | 12/2001 | H01R 13/74 |
| JP | 2007127206 | 5/2007 | |
| JP | 2007280795 | 10/2007 | H01R 13/74 |
| JP | 2009009845 | 1/2009 | H01R 13/52 |
| JP | 2011054394 | 3/2011 | |
| JP | 2012114052 | 6/2012 | |
| JP | 2013197084 | 9/2013 | |

OTHER PUBLICATIONS

Office Action issued in U.S. Appl. No. 14/558,292, dated Oct. 26, 2015 (18 pgs).
Office Action issued in U.S. Appl. No. 14/558,292, dated Feb. 5, 2016 (15 pgs).

* cited by examiner

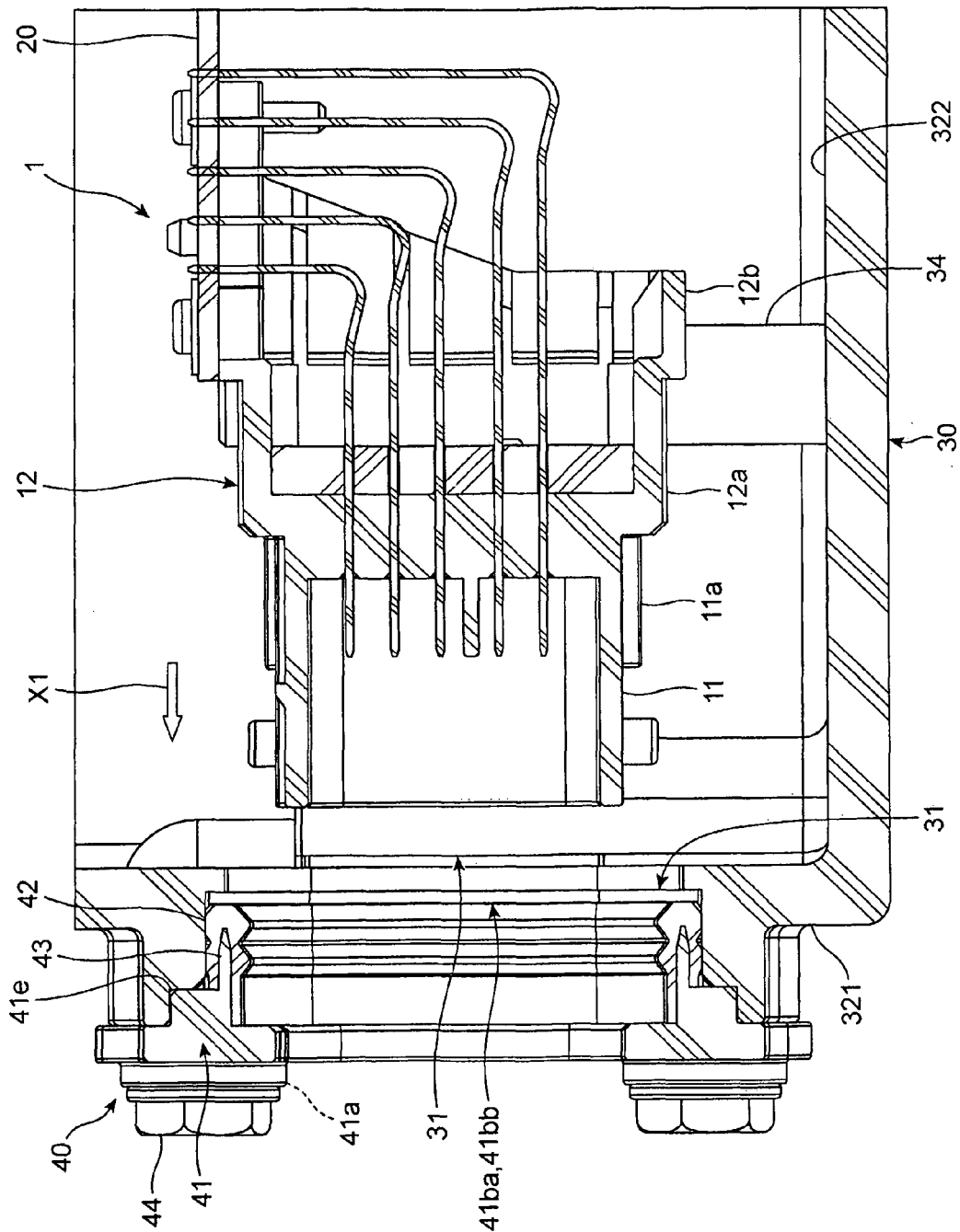

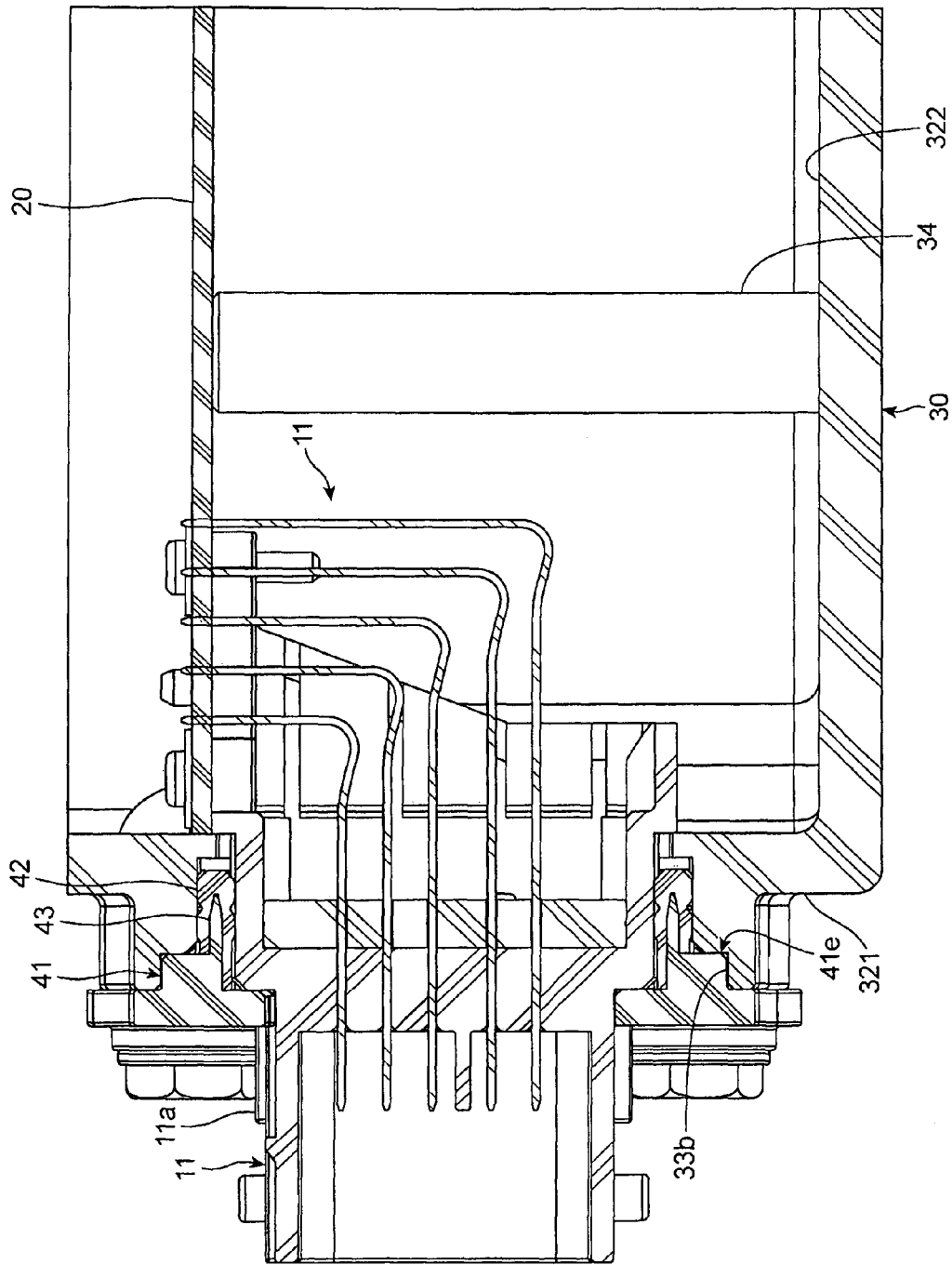

SEAL HAVING A PACKING PORTION EXTENDING FROM A FLAT PORTION WITH A STEP

BACKGROUND OF THE INVENTION

1. Field of the Invention

The invention relates to a seal used for an electric connector having a part protruding outwardly through an opening formed at a wall of a casing, the seal filling a space formed between an outer surface of the part and an inner surface of the opening. The invention relates further to a method of attaching the seal onto the casing.

2. Description of the Related Art

A kind of an electric connector is housed in a casing having a wall formed with an opening, and causes a part thereof to protrude outwardly through the opening. The electric connector is mechanically and electrically connected to a second electric connector through the part protruding outwardly through the opening. In particular, an electric connector to be equipped in an automobile is designed to include a seal to be sandwiched between the part and the opening in order to enhance waterproofness.

FIG. 10A is a perspective view of the electric connector suggested in Japanese Patent Application Publication No. 2009-9845, and FIG. 10B is a cross-sectional view of the electric connector.

As illustrated in FIG. 10B, the electric connector 1000 is mounted on a circuit board 1002 fixed in and to a casing 1001, and is mechanically and electrically connected to a second electric connector (not illustrated) through an opening 1003 formed at a wall of the casing 1001.

A cover 1004 is attached to the casing 1001 through the opening 1003. The cover 1004 includes a cylindrical portion 1008, a flange portion 1010 extending outwardly from an edge of the cylindrical portion 1008, and a seal 1009 sandwiched between the flange portion 1010 and the casing 1001. An electrically insulative housing 1006 (see FIG. 10A) holding therein contacts 1005 through which the electric connector 1000 is electrically connected to the second electric connector (not illustrated) is inserted into the cylindrical portion 1008 with a seal 1007 being sandwiched therebetween.

The electric connector 1000 illustrated in FIGS. 10A and 10B is designed to include the seals 1007 and 1009. The seal 1007 fills a space to be formed between the cylindrical portion 1008 and the housing 1006 inserted into the cylindrical portion 1008, and the seal 1009 fills a space to be formed between the flange portion 1010 and the casing 1001.

Thus, the conventional electric connector 1000 has to include the two seals 1007 and 1009 in order to have waterproofness, resulting in that the number of parts in the electric connector 1000 is unavoidably increased, and the resultant electric connector 1000 has a problem of high fabrication cost.

SUMMARY OF THE INVENTION

In view of the above-mentioned problems in the conventional electric connector, it is an object of the present invention to provide a seal used for an electric connector, capable of sufficiently ensuring waterproofness, reducing a number of parts, and decreasing fabrication cost.

In one aspect of the present invention, there is provided a seal used for an electric connector having a part protruding outwardly through a first opening formed at a wall of a casing, the seal filling a space formed between an outer surface of the part and an inner surface of the first opening, the seal including a flat portion formed with a second opening having an inner edge entirely or partially identical in shape with an inner edge of the first opening, the flat portion lying on the wall such that the second opening overlaps the first opening, and a packing portion extending from the flat portion, and making close contact with both the outer surface of the part and the inner surface of the first opening.

Since the flat portion covering the wall of the casing and the packing portion making close contact with both the outer surface of the part of the electric connector and the inner surface of the first opening are formed integrally with each other as the seal, the flat portion waterproofs a peripheral area of the first opening through which the part of the electric connector outwardly projects, and simultaneously, the packing portion waterproofs the electric connector. Thus, the electric connector fixed to the casing can be waterproofed by means of the single seal.

It is preferable that the seal further includes a core extending from the flat portion into the packing portion.

The core allows the packing portion to make close contact with both an outer surface of the part of the electric connector and an inner surface of the first opening. Furthermore, when the part of the electric connector is inserted into the first opening, the packing portion may be bent at a leading edge thereof by the electric connector making contact with the packing portion. The core supports the packing portion to thereby prevent the packing portion from being bent. Thus, the packing portion can make uniform contact with both the electric connector and the first opening.

The core may be formed entirely or partially along a shape of the packing portion.

It is preferable that the flat portion and the core are integrally formed with each other. For instance, the flat portion and the core are made of resin.

It is preferable that the flat portion is formed with a step in correspondence with a step formed at a peripheral edge of the first opening.

The step of the flat portion makes it possible to position the seal relative to the electric connector when the packing portion of the seal is inserted into the first opening, ensuring the complete waterproofness between the electric connector and the casing.

It is preferable that the packing portion has a wavy or bellowed surface at which the packing portion makes contact with the outer surface of the part and the inner surface of the first opening.

The packing portion is able to make intensively close contact with the electric connector and the first opening by virtue of the wavy or bellowed surface thereof, ensuring enhancement in waterproofness around the part of the electric connector outwardly projecting through the first opening.

It is preferable that the second opening is formed at an inner edge thereof with at least one of a recess or a projection.

The part of the electric connector may be formed with a linear projection or recess extending in a direction in which the part is inserted into the first opening of the casing, in which case, when the seal is first attached to the first opening, and then, the electric connector is inserted into the first opening, the electric connector can be guided by the recess or projection thereof engaging in the projection or recess formed at the second opening of the flat portion. Accordingly, it is possible to insert the electric connector straightly into the first opening by virtue of the recess or projection, ensuring that the seal can make contact with the first opening without positional deviation, and that the packing portion can be prevented from being damaged.

In another aspect of the present invention, there is provided a method of attaching the above-mentioned seal onto a casing, including attaching the flat portion onto the wall such that the second opening overlaps the first opening and the packing portion makes contact at an outer surface thereof with an inner surface of the first opening, and inserting the part of the electric connector into the first opening.

By firstly attaching the seal to the casing, and secondly inserting the part of the electric connector into the first opening of the casing, the casing to which the electric connector is fixed can be waterproofed by means of the single seal.

The advantages obtained by the aforementioned present invention will be described hereinbelow.

In accordance with the present invention, the casing to which the electric connector is fixed can be waterproofed by means of the single seal. Thus, the present invention provides sufficient waterproofness, reduction in a number of parts, and further, reduction in fabrication cost.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 9A is a cross-sectional view of the electric connector, the casing, and the seal, showing a process of attaching the seal to the casing.

FIG. 9B is a cross-sectional view of the electric connector, the casing, and the seal, showing a process of attaching the seal to the casing.

DESCRIPTION OF THE PREFERRED EMBODIMENTS

Figure 1:
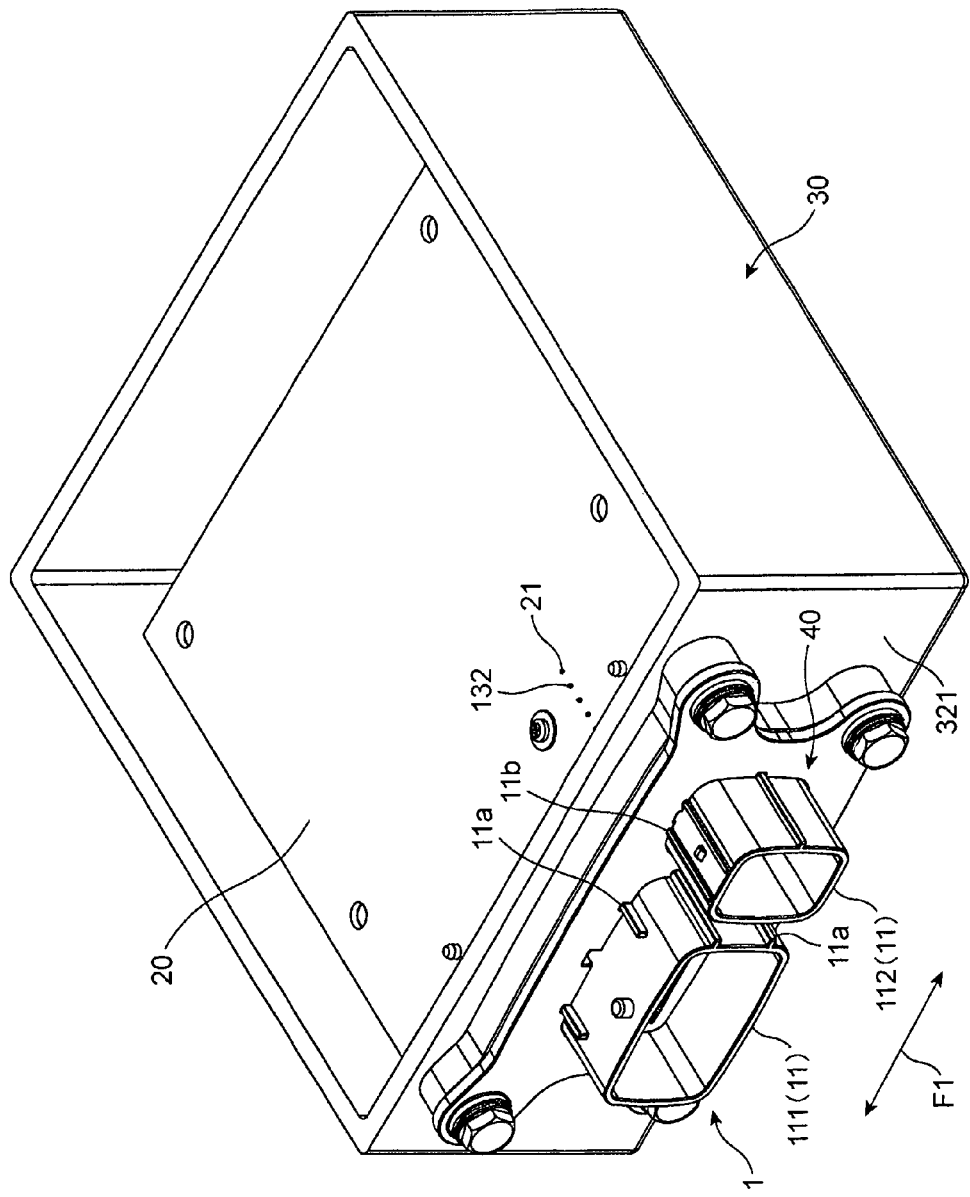
FIG. 1 is a broken perspective view of the electric connector mounted on a printed circuit board, the seal, and the casing in which the electric connector is housed.

The seal in accordance with the preferred embodiment of the present invention is explained hereinbelow with reference to drawings. In the specification, a "front" of the electric connector indicates a side of the electric connector through which the electric connector is connected to a second electric connector, a "rear" or "back" of the electric connector indicates a side opposite to the "front", a "lower" indicates a direction from the electric connector to a floor of the casing, and an "upper" indicates a direction opposite to the "lower".

As illustrated in FIGS. 1 to 4, an electric connector 1 is mounted on a printed circuit board 20. The electric connector 1 is housed in a casing 30 together with the printed circuit board 20. The electric connector 1 is mechanically and electrically connected to a second electric connector (not illustrated) to which a cable is connected. The casing 30 is in the form of a box (a cover thereof is not illustrated).

The casing 30 is formed at a front wall 321 with an opening 31. As mentioned later, a seal 40 in accordance with the embodiment fills a space to be formed between an inner surface of the opening 31 and an outer surface of the electric connector 1.

Figure 5:
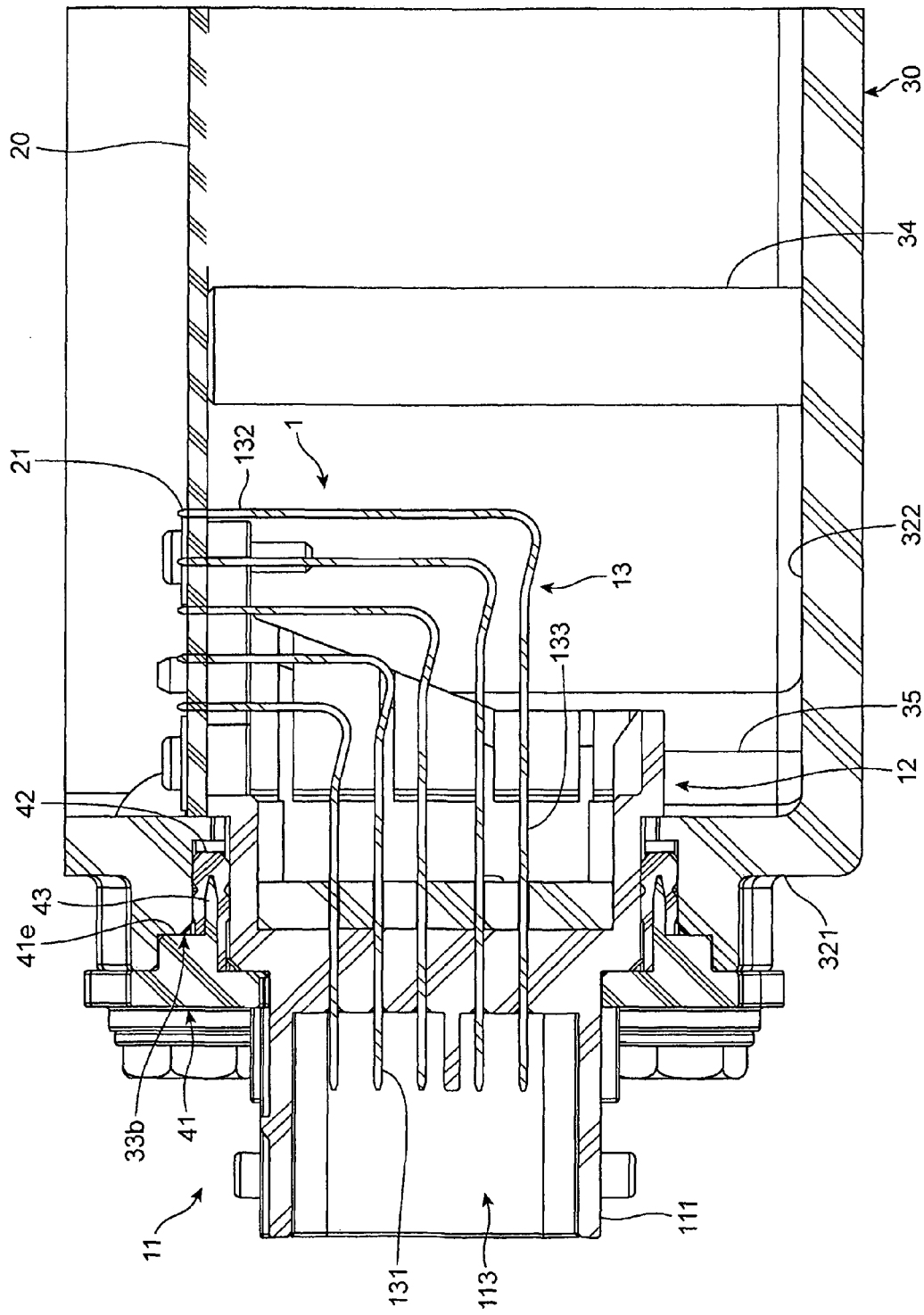
FIG. 5 is a cross-sectional view of the electric connector, the casing, and the seal.
Figure 6:
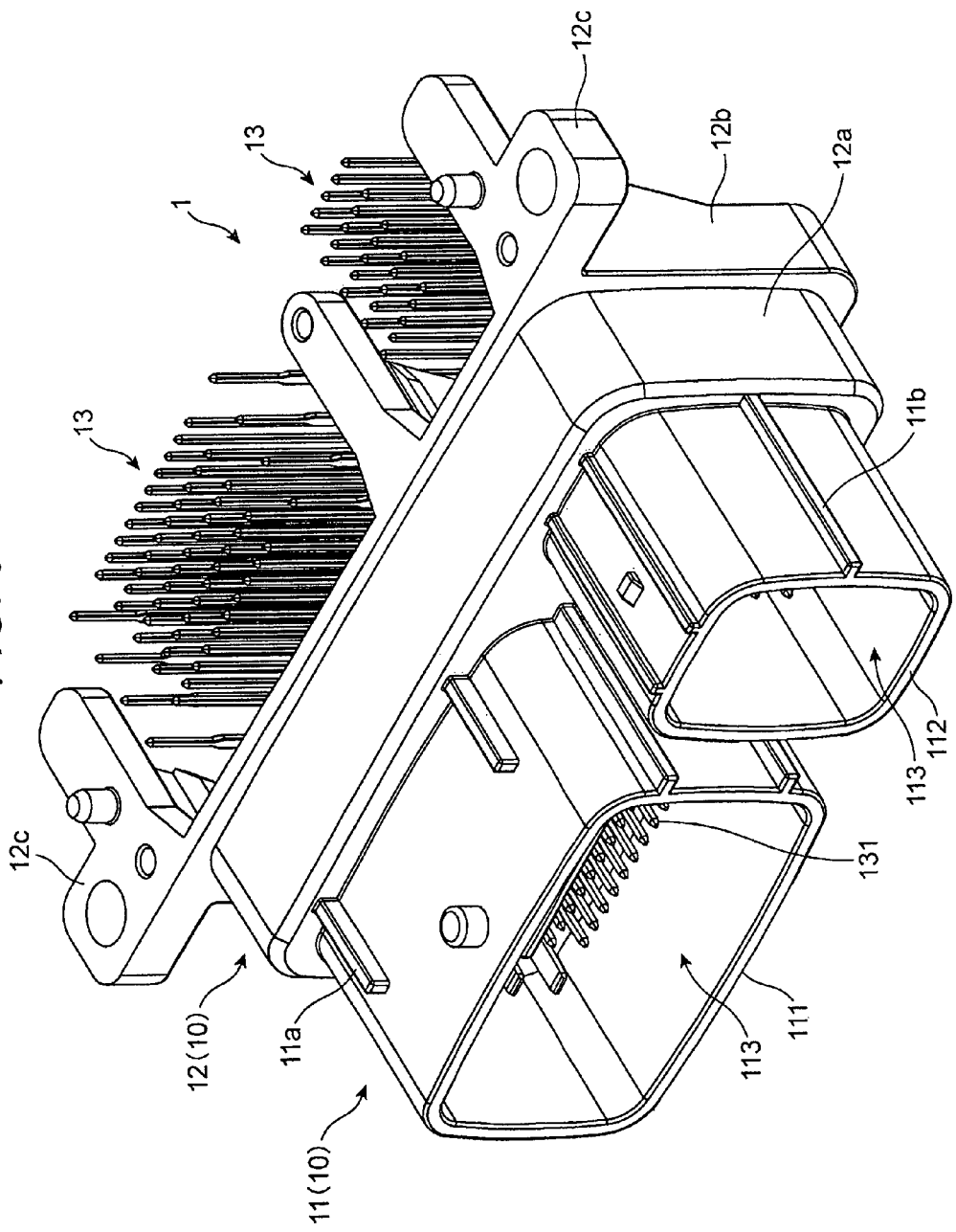
FIG. 6 is a perspective view of the electric connector.

As illustrated in FIGS. 5 and 6, the electric connector 1 includes a fitting portion 11 (defined as "a part" in claim 1) through which the electric connector 1 is connected to the second electric connector, a body 12, and a plurality of male connector terminals 13 making mechanical and electrical contact with female connector terminals of the second electric connector. The fitting portion 11 is formed at a front of the body 12. The fitting portion 11 and the body 12 are formed integral with each other by a resin molding process.

Figure 2:
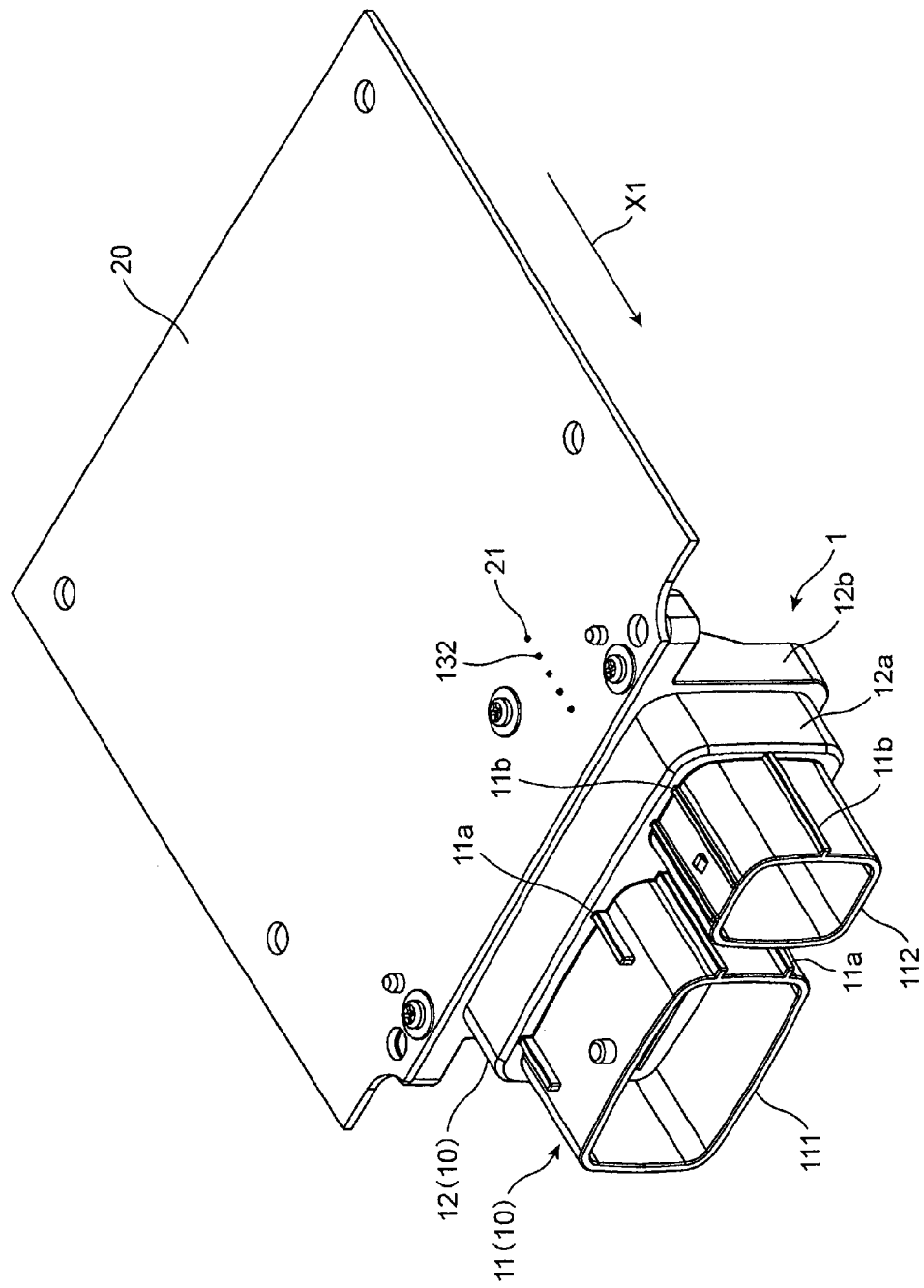
FIG. 2 is a perspective view of the electric connector mounted on a printed circuit board.

As illustrated in FIG. 2, the fitting portion 11 includes a first fitting portion 111 and a second fitting portion 112 both arranged in a width-wise direction F1 (see FIG. 1) of the casing 30 or in a length-wise direction of the front wall 321. Both of the first and second fitting portions 111 and 112 have a hollow inner space 113. As illustrated in FIG. 5, the male connector terminals 13 extend in the inner space 113. The first fitting portion 111 is designed to have a larger cross-sectional area than that of the second fitting portion 112.

The first fitting portion 111 is formed at an upper surface, a lower surface and a side surface facing the second fitting portion 112 with projections 11a linearly extending in a direction X1 in which the fitting portion 11 is inserted into the opening 31. The projections 11a formed on the upper surface has a length nearly equal to a half of a length of the upper surface measured in the direction X1, and the projections 11a formed on the side surface has a length equal to a length of the upper surface in the direction X1. The second fitting portion 112 is formed at an upper surface and a side surface not facing the first fitting portion 111 with projections 11b linearly extending in the direction X1. The projections 11b have a length equal to a length of the upper surface in the direction X1.

The body 12 includes a terminal support portion 12a and a skirt portion 12b.

The terminal support portion 12a has a rectangular cross-section with rounded corners. The fitting portion 11 is formed on the terminal support portion 12a such that the inner space 113 forwardly directs. As illustrated in FIG. 5, the male connector terminals 13 are supported by the terminal support portion 12a by partially being embedded in the terminal support portion 12a. The skirt portion 12b backwardly extends from the terminal support portion 12a to thereby act as a protective cover for the male connector terminals 13. As illustrated in FIG. 6, the skirt portion 12b is formed at opposite ends thereof in the direction F1 (see FIG. 1) with extensions 12c through which the body 12 is screwed to the casing 30.

As illustrated in FIG. 5, each of the male connector terminals 13 includes a first portion 131 linearly extending forwardly from the body 12 into the inner spaces 113 of the first and second fitting portions 111 and 112, the first portion 141 being in the form of a pin, a second portion 132 extending backwardly from the body 12 towards the printed circuit board 20, the second portion 142 being L-shaped, and a third portion 133 embedded in the body 12 and connecting the first and second portions 131 and 132 to each other.

The first portion 131 is inserted into and makes electrical contact with a female connector terminal of the second electric connector fit into the fitting portion 11. The second portion 132 is inserted at a distal end thereof into a through-hole formed through the printed circuit board 20 to thereby be electrically connected to an electric part (not illustrated) mounted on the printed circuit board 20. The third portion 133 is embedded in the body 12 to thereby enable the first and second portions 131 and 132 to be supported by the body 12.

As illustrated in FIG. 6, the male connector terminals 13 are arranged in a matrix (5×10 rows) to extend into the inner space 113 of the first fitting portion 111, and the male connector terminals 13 are arranged in a matrix (5×5 rows) to extend into the inner space 113 of the second fitting portion 112.

As illustrated in FIG. 1, the printed circuit board 20 is almost rectangular, and is fixed to the casing 30 by means of screws such that there is a space in which the electric connector 1 is housed in the casing 30. The printed circuit board 20 is formed with through-holes 21 through which the second portions 132 of the male connector terminals 13 are inserted.

Figure 3:
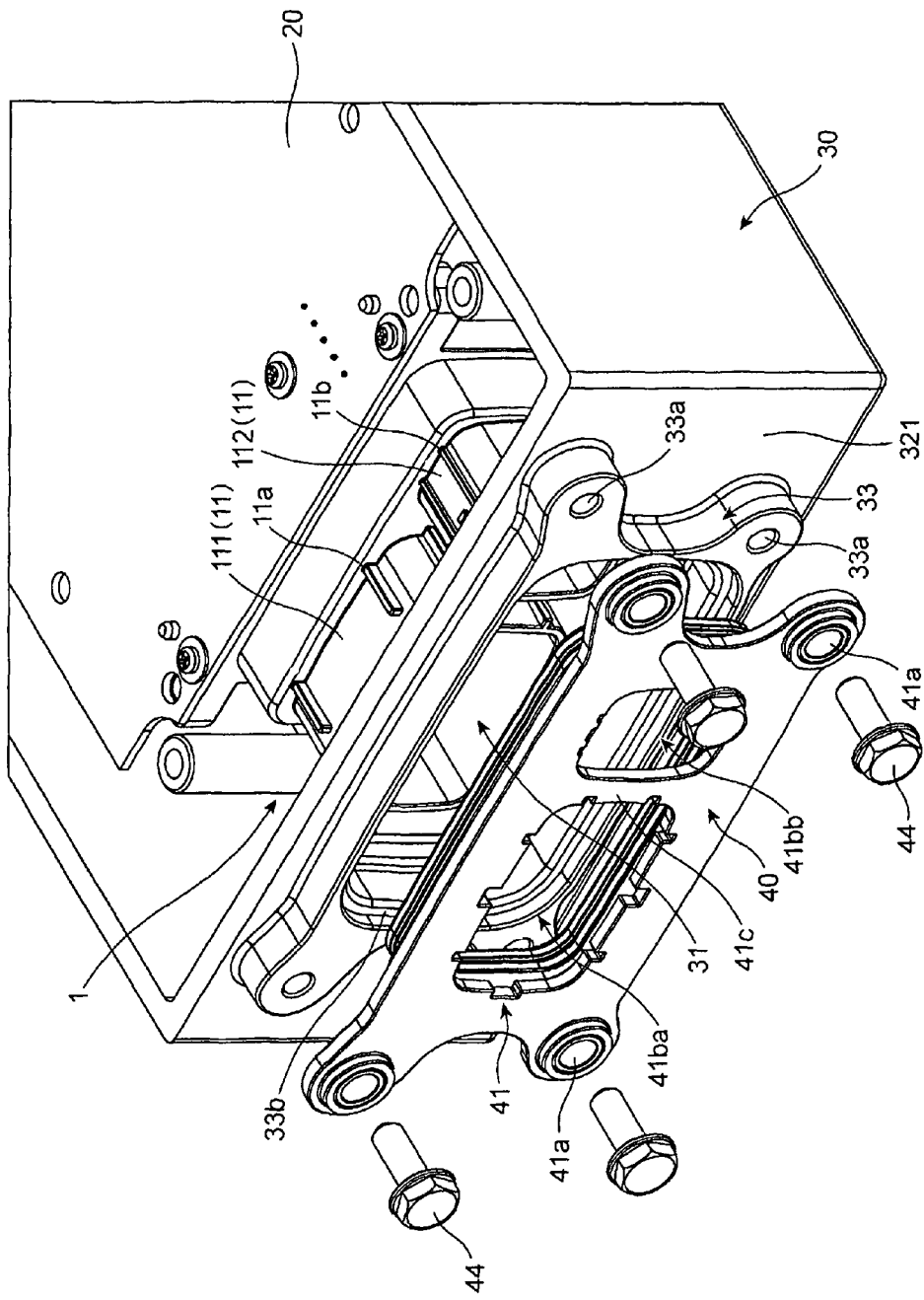
FIG. 3 is a partial broken perspective view of the electric connector mounted on a printed circuit board, the seal, and the casing in which the electric connector is housed.
Figure 4:
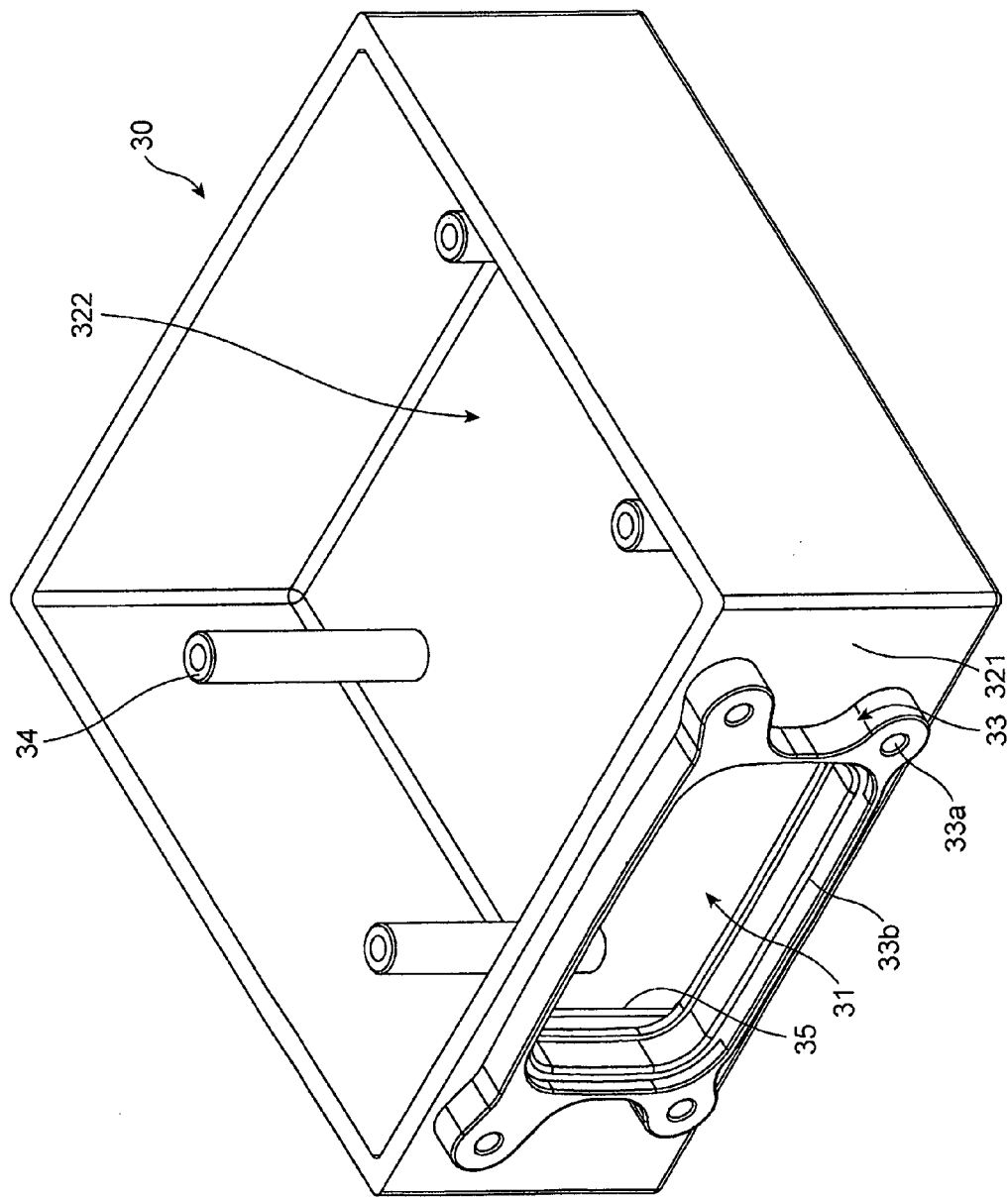
FIG. 4 is a perspective view of the casing.

As illustrated in FIGS. 3 to 5, the casing 30 is an aluminum die-cast product, and is in the form of a rectangular parallelepiped box. As mentioned earlier, the casing 30 is formed at the front wall 321 thereof with the opening 31 through which the fitting portion 11 of the electric connector 1 projects outwardly of the casing 30. The opening 31 is rectangular with rounded corners.

The casing 30 further includes a thick plate 33 fixedly attached to or formed integral with front wall 321. The plate 33 is formed with openings 41ba and 41bb, as illustrated in FIG. 3. The first fitting portion 111 is fittable into the opening 41ba, and the second fitting portion 112 is fittable into the opening 41bb. The openings 41ba and 44bb are separated from each other by a partition 41c. The openings 41ba and 41bb of the plate 33 align with the opening 31 as if the opening 31 extends through the plate 33. The plate 33 is formed at four corners thereof with threaded holes 33a for screwing the seal 40 to the plate 33. As illustrated in FIG. 5, the plate 33 is formed at an inner surface thereof and along a peripheral edge of the opening 31 with a stepped portion 33b.

As illustrated in FIGS. 4 and 5, the casing 30 includes therein four legs 34 to which the printed circuit board 20 is screwed, and a pair of pillars 35 to which the printed circuit board 20 is screwed together with the electric connector 1 mounted on the printed circuit board 20.

Figure 7:
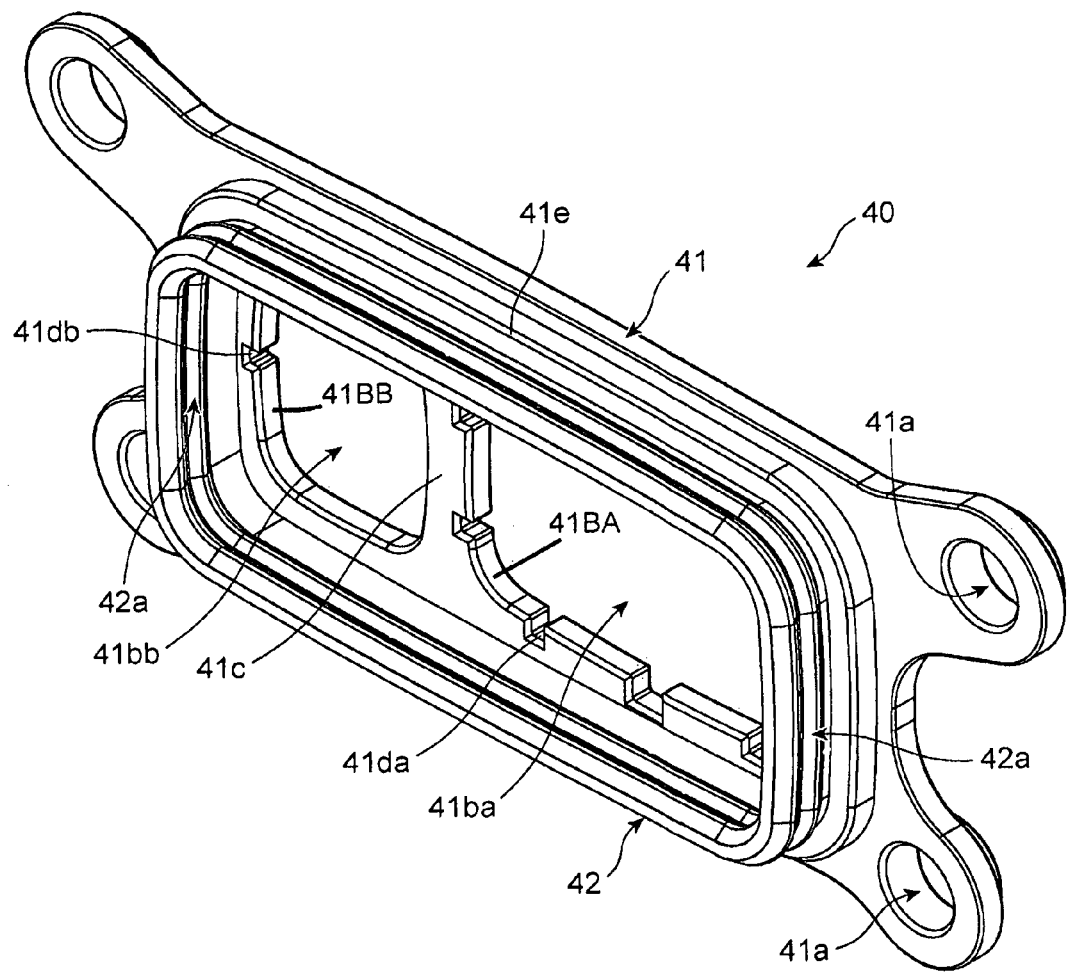
FIG. 7 is a perspective view of the seal.
Figure 8:
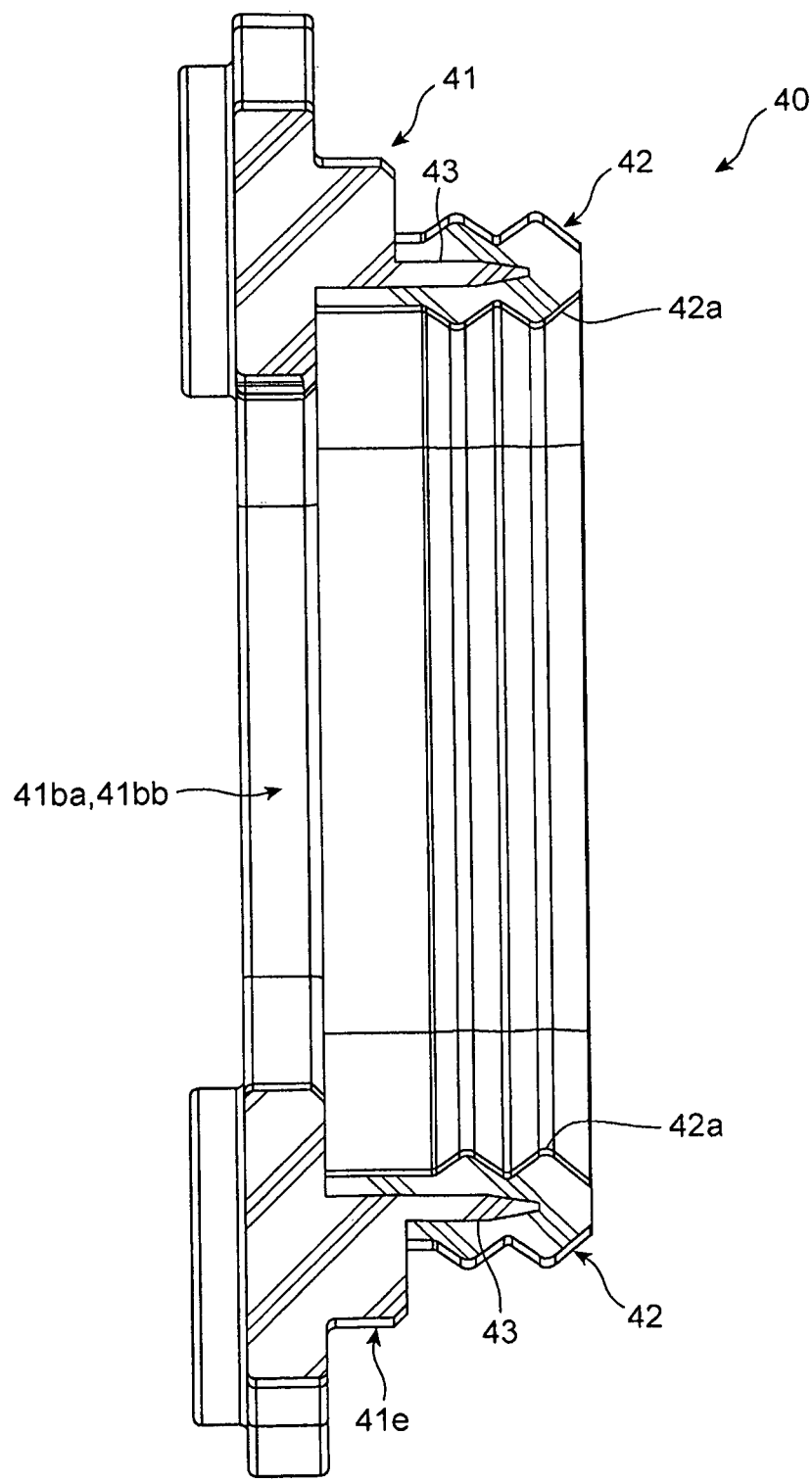
FIG. 8 is a cross-sectional view of the seal.

As illustrated in FIGS. 3, 7 and 8, the seal 40 includes a flat portion 41 formed with the openings 41ba and 41bb having an outer periphery as that of the opening 31 and closely attached onto the front wall 321 such that the openings 41ba and 41bb overlap the opening 31, a packing portion 42 extending from the flat portion 41 towards the opening 31 and making close contact with both an outer surface of the fitting portion 11 and an inner surface of the opening 31, and a core 43 formed on the flat portion 41 and extending into the packing portion 42 to thereby support the packing portion 42.

The flat portion 41, the packing portion 42 and the core 43, defining the seal 40, are formed integral with each other as a single product. The flat portion 41 and the core 43 are integrally formed by resin molding without a seam.

The flat portion 41 has the same shape as that of the plate 33. The flat portion 41 is formed at four corners thereof with fixing holes 41a through which the seal 40 is screwed to the threaded holes 33a of the plate 33 by means of screws 44.

As illustrated in FIG. 7, the opening 41ba is formed at an inner edge 41BA thereof with recesses 41da for allowing the projections 11a to pass therethrough, and the opening 41bb is formed at an inner edge 41BB thereof with recesses 41db for allowing the projections 11b to pass therethrough.

The flat portion 41 is formed with a stepped portion 41e to be engaged with the stepped portion 33b formed at the plate 33.

The packing portion 42 is made of rubber so that the packing portion 42 makes close contact with the electric connector 1 and the opening 31 of the casing 30 therebetween.

The packing portion 42 has the same outer periphery as that of the opening 31 of the casing 30.

As illustrated in FIG. 8, the packing portion 42 has a wavy or bellowed surface 42a at which the packing portion 42 makes contact with an outer surface of the fitting portion 11 and an inner surface of the opening 31.

The packing portion 42 may be first fabricated, and then, the core 43 may be inserted into the packing portion 42. As an alternative, the core 43 may be first formed on the flat portion 41, and then, the packing portion 42 may be formed around the core 43 by vulcanization junction process.

The core 43 is formed entirely around the opening 31. Since the core 43 extends from the flat portion 41 towards the opening 31 and penetrates the packing portion 42 to thereby support the packing portion 42. If the core 43 can sufficiently support the packing portion 42, the core 43 may be formed partially around the opening 31.

A process of setting the electric connector 1 having the above-mentioned structure to the casing 30 is explained hereinbelow with reference to the drawings.

As illustrated in FIG. 9A, the seal 40 is attached onto the front wall 321 in which the opening 31 is formed. Specifically, the flat portion 41 is put on the front wall 321 such that the packing portion 42 is inserted into the opening 31, and the fixing holes 41a are aligned with the threaded holes 33a of the plate 33 (see FIG. 3). Then, the screws 44 are threaded into the threaded holes 33a through the fixing holes 41a. Thus, the seal 40 is fixed to the casing 30.

Since the electric connector 1 is not yet fixed to the casing 30, the seal 40 can be readily set onto the front wall 321 and into the opening 31. Furthermore, since the stepped portion 41e formed at the flat portion 41 is engaged with the stepped portion 33b formed at the opening 31, the seal 40 can be accurately positioned relative to the casing 30.

Then, as illustrated in FIG. 9B, the fitting portion 11 of the electric connector 1 is forwarded towards the opening 31. Before the body 12 makes contact with the packing portion 42 of the seal 40, the first and second fitting portions 111 and 112 start being inserted into the openings 41ba and 41bb of the seal 40, respectively.

When the first and second fitting portions 111 and 112 are inserted into the openings 41ba and 41bb, the projections 11a and 11b are caused to pass through the recesses 41da and 41db, respectively, while the fitting portion 11 is forwarded towards the opening 31 and then projected outwardly through the opening 31. Thus, since the electric connector 1 can be forwarded straightly to the opening 31, it is possible to allow the electric connector 1 to make contact with the seal 40 without positional deviation.

Then, the printed circuit board 20 is screwed to the casing 30. Thus, the electric connector 1 is fixed to the casing 30.

In the above-mentioned process, the seal 40 is first attached to the casing 30, and then, the electric connector 1 is fixed to the casing 30.

Figure 10A:
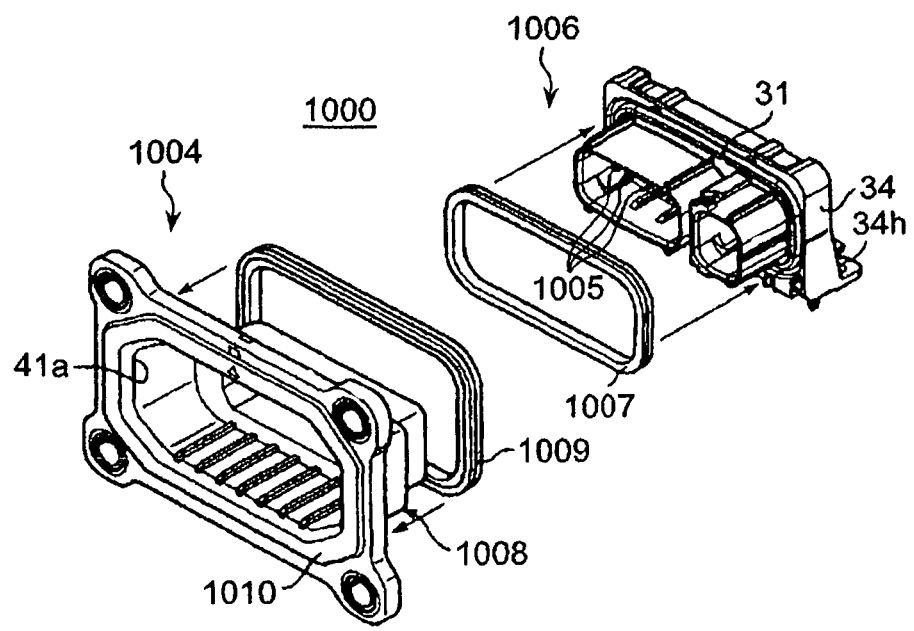
FIG. 10A is a perspective view of the conventional electric connector.
Figure 10B:
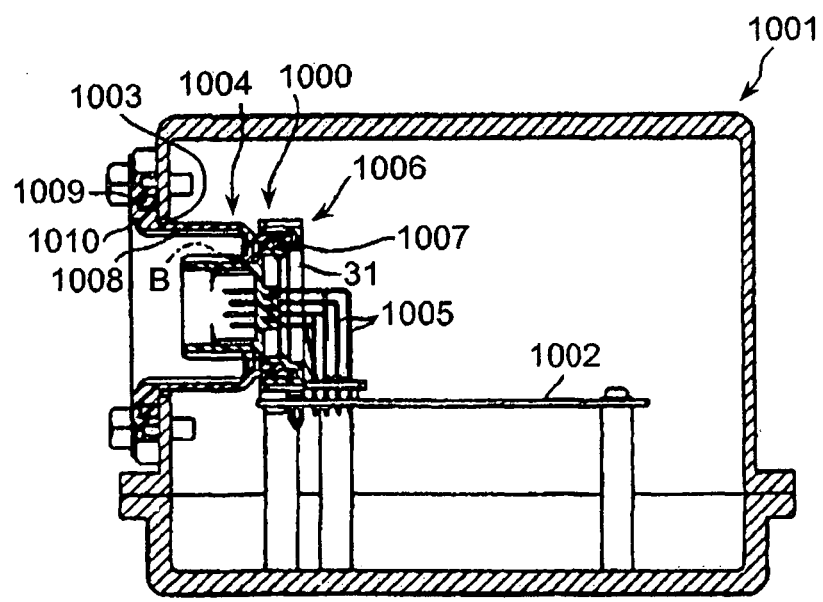
FIG. 10B is a cross-sectional view of the electric connector illustrated in FIG. 10A.

In contrast, in the conventional electric connector 1000 illustrated in FIGS. 10A and 10B, the housing 1006 including the seal 1007 is first fixed to the casing 1001, and then, the cover 1004 including the seal 1009 is fixed to the casing 1001. This is because the seals 1007 and 1009 are separate parts from each other.

The seal 40 in accordance with the embodiment includes the flat portion 41 and the packing portion 42 both formed integral with each other, and is attached to the casing 30 from outside of the casing 30. Accordingly, if the electric connector 1 is first fixed to the casing 30, when the seal 40 is attached to the casing 30, the packing portion 42 has to be inserted into a space formed between the opening 31 and the terminal support portion 12a of the body 12. Thus, it may be difficult to insert the packing portion 42 into the space.

On the contrary, if the seal 40 is first attached to the casing 30, the electric connector 1 is forwarded making slide contact with an inner surface of the packing portion 42, and thus, the packing portion 42 may be bent at a distal end thereof by the electric connector 1 forwarded in the direction X1 making contact with the packing portion 42. However, the core 43 supports the packing portion 42 to thereby prevent the packing portion 42 from being bent. Thus, the packing portion 42 can make uniform contact with the electric connector 1 and the opening 31 without being bent.

As explained so far, in the seal 40 in accordance with the embodiment, the flat portion 41 attached onto the front wall 321 of the casing 30 and the packing portion 42 sandwiched between an inner surface of the opening 31 and the fitting portion 11 are formed integral with each other. The flat portion 41 waterproofs an area around the opening 31 in the front wall 321, and the packing portion 42 waterproofs an area around the fitting portion 11.

Thus, the electric connector 1 fixed to the casing 30 can be waterproofed by means of the single seal 40, ensuring sufficient waterproofness to the electric connector 1 together with the reduction in a number of parts of the electric connector 1 and accordingly the reduction in costs for fabricating the electric connector 1.

Furthermore, since the flat portion 41 and the core 43 are formed of resin integrally with each other, the packing portion 42 is sufficiently supported by the core 43.

Since the flat portion 41 of the seal 40 is formed with the stepped portion 41e to be engaged with the stepped portion 33b formed at a periphery of the opening 31, the flat portion 41 can be readily positioned relative to the opening 31 when the seal 40 is attached to the casing 30. Thus, the packing portion 42 can be accurately positioned relative to the casing 30, ensuring complete waterproofness to the electric connector 1.

Furthermore, since the surface 42a of the packing portion 42 is designed to be wavy or bellowed, raised portions in the surface 42a are depressed when the packing portion 42 makes contact with the electric connector 1 and the opening 31, and thus, the packing portion 42a can make close contact with the electric connector 1 and the opening 31, ensuring that the packing portion 42 can waterproof the body 12 and an inner surface of the opening 31.

In the above-mentioned embodiment, the flat portion 41 and the core 43 are made of hard resin, and the packing portion 42 is made of rubber. That is, the flat portion 41, the core 43 and the packing portion 42 are made of different materials from one another, and formed integral with one another. The flat portion 41 and the packing portion 42 may be formed of different materials by a two-color molding process. The flat portion 41 and the packing portion 42 may be fabricated separately from each other, and then, they may be coupled into a single piece.

In the above-mentioned embodiment, the first and second fitting portions 111 and 112 are formed with the projections 11a and 11b, and the flat portion 41 is formed with the recesses 41da and 41db. As an alternative, the first and second fitting portions 111 and 112 may be formed with recesses, and the flat portion 41 may be formed with projections.

In the above-mentioned embodiment, the seal 40 is first fixed to the casing 30, and then, the electric connector 1 is fixed to the casing 30. If the packing portion 42 can be inserted into a space formed between the opening 31 and the terminal support portion 12a of the body 12, the electric connector 1 may be first fixed to the casing 30, and then, the seal 40 may be fixed to the casing 30.

INDUSTRIAL APPLICABILITY

The seal in accordance with the present invention is suitable to an electric connector required to have waterproofness and fixed into a casing in which an electric circuit necessary to be protected from water penetration is housed. In particular, the seal is suitable to an electric connector to be equipped in an automobile employed in drastically changing environments.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Applications Nos. 2013-264075 and 2013-264180 both filed on Dec. 20, 2013 and of Japanese Patent Application No. 2014-004432 filed on Jan. 14, 2014 including specification, claims, drawings and summary is incorporated herein by reference in its entirety.

What is claimed is:

1. A seal used for an electric connector having a fitting portion protruding outwardly through a first opening formed at a wall of a casing, said seal filling a space formed between an outer surface of said fitting portion and an inner surface of said first opening, said electric connector being connected to another electric connector through said fitting portion,
   said seal including:
   a flat portion formed with a second opening having an inner edge entirely or partially identical in shape with an inner edge of said first opening, said flat portion lying on said wall such that said second opening overlaps said first opening; and
   a packing portion extending from said flat portion, and making close contact with both said outer surface of said fitting portion and said inner surface of said first opening,
   wherein
   a body formed continuously to said fitting portion makes close contact at a periphery thereof with said packing portion, and
   said flat portion is formed with a step in correspondence with a step formed at a peripheral edge of said first opening.

2. The seal as set forth in claim 1, further including a core extending from said flat portion into said packing portion.

3. The seal as set forth in claim 2, wherein said core is formed to be entirely inserted into said packing portion.

4. The seal as set forth in claim 2, wherein said core is formed to be partially inserted into said packing portion.

5. The seal as set forth in claim 2, wherein said flat portion and said core are integrally formed with each other.

6. The seal as set forth in claim 5, wherein said flat portion and said core are made of resin.

7. The seal as set forth in claim 1, wherein said packing portion has a wavy or bellowed surface at which said packing portion makes contact with said outer surface of said part and said inner surface of said first opening.

8. The seal as set forth in claim 1, wherein said second opening is formed at an inner edge thereof with at least one of a recess or a projection.

9. A method of attaching a seal defined in claim 1 onto a casing, including:
   attaching said flat portion onto said wall such that said second opening overlaps said first opening and said packing portion makes contact at an outer surface thereof with an inner surface of said first opening; and
   inserting said fitting portion of said electric connector into said first opening.

* * * * *